United States Patent
Akebono

(10) Patent No.: US 10,284,152 B2
(45) Date of Patent: May 7, 2019

(54) AMPLIFIER, AUDIO SIGNAL OUTPUT METHOD, AND ELECTRONIC DEVICE

(71) Applicant: SONY SEMICONDUCTOR SOLUTIONS CORPORATION, Kanagawa (JP)

(72) Inventor: Sachio Akebono, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/763,905

(22) PCT Filed: Sep. 29, 2016

(86) PCT No.: PCT/JP2016/078750
§ 371 (c)(1),
(2) Date: Mar. 28, 2018

(87) PCT Pub. No.: WO2017/065010
PCT Pub. Date: Apr. 20, 2017

(65) Prior Publication Data
US 2018/0278217 A1    Sep. 27, 2018

(30) Foreign Application Priority Data

Oct. 13, 2015 (JP) ................... 2015-201725

(51) Int. Cl.
*H03F 3/45* (2006.01)
*H03F 3/217* (2006.01)
(Continued)

(52) U.S. Cl.
CPC .............. *H03F 1/34* (2013.01); *H03F 3/183* (2013.01); *H03F 3/187* (2013.01); *H03F 3/211* (2013.01);
(Continued)

(58) Field of Classification Search
CPC . H03F 1/34; H03F 3/183; H03F 3/211; H03F 3/217; H03F 3/45071;
(Continued)

(56) References Cited

U.S. PATENT DOCUMENTS 4,371,840 A    2/1983    Yokoyama
7,463,089 B1 *  12/2008   Bapat ................ H03F 3/217
                                                                    330/10
(Continued)

FOREIGN PATENT DOCUMENTS

JP          56-26416 U     3/1981
JP          56-87719 U     7/1981
(Continued)

OTHER PUBLICATIONS

International Search Report and Written Opinion of PCT Application No. PCT/JP2016/078750, dated Nov. 29, 2016, 09 pages.

*Primary Examiner* — Sonia L Gay
(74) *Attorney, Agent, or Firm* — Chip Law Group

(57) ABSTRACT

The present technology relates to an amplifier, an audio signal output method, and an electronic device that can inhibit unintended sound output in a class D amplifier that changes a peak value of a PWM signal. The amplifier includes: a positive-side amplitude generating circuit configured to generate positive-side amplitude of an output PWM signal that is a PWM signal to be output outside an apparatus; a negative-side amplitude generating circuit configured to generate negative-side amplitude of the output PWM signal; and a feedback circuit configured to feed back a difference between the amplitude generated by the positive-side amplitude generating circuit and the amplitude generated by the negative-side amplitude generating circuit to the positive-side amplitude generating circuit and the negative-side amplitude generating circuit. The present tech- (Continued)

nology is applicable, for example, to an amplifier or the like of an electronic device such as an audio player.

7 Claims, 8 Drawing Sheets

(51) Int. Cl.
  *H03F 3/34* (2006.01)
  *H03F 3/183* (2006.01)
  *H03F 3/21* (2006.01)
  *H04R 3/00* (2006.01)
  *H03F 1/34* (2006.01)
  *H03F 3/187* (2006.01)
(52) U.S. Cl.
  CPC ........... *H03F 3/217* (2013.01); *H03F 3/2173* (2013.01); *H03F 3/45071* (2013.01); *H03F 3/45475* (2013.01); *H04R 3/00* (2013.01); *H03F 2200/03* (2013.01); *H03F 2200/123* (2013.01); *H03F 2200/129* (2013.01); *H03F 2200/171* (2013.01); *H03F 2200/267* (2013.01); *H03F 2200/351* (2013.01); *H03F 2200/387* (2013.01); *H03F 2203/21139* (2013.01); *H03F 2203/21157* (2013.01); *H03F 2203/45022* (2013.01); *H03F 2203/45116* (2013.01); *H03F 2203/45138* (2013.01); *H03F 2203/45521* (2013.01); *H03F 2203/45528* (2013.01)

(58) Field of Classification Search
  CPC ........... H03F 2200/03; H03F 2200/123; H03F 2200/129; H03F 2200/171; H03F 2200/267; H03F 2200/351; H03F 2200/387; H03F 2203/21139; H03F 2203/21157; H03F 2203/45022; H03F 2203/45116; H03F 2203/45521; H03F 2203/45528
  See application file for complete search history.

(56) References Cited

U.S. PATENT DOCUMENTS

| | | | |
|---|---|---|---|
| 2007/0139103 A1* | 6/2007 | Roeckner | H03F 1/305 330/10 |
| 2010/0321570 A1* | 12/2010 | Odagiri | H03F 3/217 348/500 |
| 2014/0192989 A1* | 7/2014 | Quilter | H03F 1/0277 381/28 |

FOREIGN PATENT DOCUMENTS

| | | |
|---|---|---|
| JP | 56-087719 U | 7/1981 |
| JP | 08-69332 A | 3/1996 |
| JP | 2007-150833 A | 6/2007 |
| JP | 2011-066559 A | 3/2011 |

* cited by examiner

AMPLIFIER, AUDIO SIGNAL OUTPUT METHOD, AND ELECTRONIC DEVICE

CROSS REFERENCE TO RELATED APPLICATIONS

This application is a U.S. National Phase of International Patent Application No. PCT/JP2016/078750 filed on Sep. 29, 2016, which claims priority benefit of Japanese Patent Application No. JP 2015-201725 filed in the Japan Patent Office on Oct. 13, 2015. Each of the above-referenced applications is hereby incorporated herein by reference in its entirety.

TECHNICAL FIELD

The present technology relates to an amplifier, an audio signal output method, and an electronic device, and in particular to an amplifier, an audio signal output method, and an electronic device that can inhibit unintended sound output in a class D amplifier that changes a peak value of a PWM signal.

BACKGROUND ART

Class D amplifiers that each output a PWM signal, which is a signal that has undergone pulse width modulation, and amplify electric power are known (for example, refer to Patent Document 1). The Class D amplifiers include a feedback type and a non-feedback type, and the feedback type, which corrects an error of an output signal, is easy to reduce distortion and can obtain desired output signal characteristics. The class D amplifiers are used for power amplification of an audio signal and the like.

CITATION LIST

Patent Document

Patent Document 1: Japanese Patent Application Laid-Open No. 2011-66559

SUMMARY OF THE INVENTION

Problems to be Solved by the Invention

In that connection, there is a class D amplifier that controls an output level by changing a peak value of a PWM signal. If a peak value of a PWM signal to output can be reduced, a noise level depending on an operating frequency, a modulation method, and the like of a digital circuit in an upstream stage can be reduced, and therefore, for example, noise can be reduced in a silent state or the like.

In the class D amplifier that changes a peak value of a PWM signal, for example, a method of switching and outputting a positive-side peak value and a negative-side peak value around a ground voltage cab be employed. At this time, if an imbalance occurs between the positive-side peak value and the negative-side peak value, a remaining output level caused by the imbalance is output as a sound, causing an unusual sound called clicking noise or pop noise.

The present technology has been made in view of such a situation, and allows unintended sound output to be inhibited in a class D amplifier that changes a peak value of a PWM signal.

Solutions to Problems

An amplifier according to a first aspect of the present technology includes: a positive-side amplitude generating circuit configured to generate positive-side amplitude of an output PWM signal that is a PWM signal to be output outside an apparatus; a negative-side amplitude generating circuit configured to generate negative-side amplitude of the output PWM signal; and a feedback circuit configured to feed back a difference between the amplitude generated by the positive-side amplitude generating circuit and the amplitude generated by the negative-side amplitude generating circuit to the positive-side amplitude generating circuit and the negative-side amplitude generating circuit.

An audio signal output method according to a second aspect of the present technology includes, in an amplifier including a positive-side amplitude generating circuit, a negative-side amplitude generating circuit, a feedback circuit, and a PWM signal output circuit: generating, by the positive-side amplitude generating circuit, positive-side amplitude of an output PWM signal that is a PWM signal to be output outside an apparatus; generating, by the negative-side amplitude generating circuit, negative-side amplitude of the output PWM signal; feeding back, by the feedback circuit, a difference between the amplitude generated by the positive-side amplitude generating circuit and the amplitude generated by the negative-side amplitude generating circuit to the positive-side amplitude generating circuit and the negative-side amplitude generating circuit; and outputting, by the PWM signal output circuit, the output PWM signal based on the amplitude generated by the positive-side amplitude generating circuit and the negative-side amplitude generating circuit as an audio signal.

In the second aspect of the present technology, positive-side amplitude of an output PWM signal that is a PWM signal to be output outside an apparatus is generated by the positive-side amplitude generating circuit, negative-side amplitude of the output PWM signal is generated by the negative-side amplitude generating circuit, a difference between the amplitude generated by the positive-side amplitude generating circuit and the amplitude generated by the negative-side amplitude generating circuit is fed back to the positive-side amplitude generating circuit and the negative-side amplitude generating circuit, and the output PWM signal based on the amplitude generated by the positive-side amplitude generating circuit and the negative-side amplitude generating circuit is output by the PWM signal output circuit as an audio signal.

An electronic device according to a third aspect of the present technology includes an amplifier including: a positive-side amplitude generating circuit configured to generate positive-side amplitude of an output PWM signal that is a PWM signal to be output outside an apparatus; a negative-side amplitude generating circuit configured to generate negative-side amplitude of the output PWM signal; and a feedback circuit configured to feed back a difference between the amplitude generated by the positive-side amplitude generating circuit and the amplitude generated by the negative-side amplitude generating circuit to the positive-side amplitude generating circuit and the negative-side amplitude generating circuit.

In the first and third aspects of the present technology, positive-side amplitude of an output PWM signal that is a PWM signal to be output outside an apparatus is generated, negative-side amplitude of the output PWM signal is generated, and a difference between the amplitude generated by the positive-side amplitude generating circuit and the amplitude generated by the negative-side amplitude generating circuit is fed back to the positive-side amplitude generating circuit and the negative-side amplitude generating circuit.

The amplifier may be an independent apparatus and may be an internal block constituting one apparatus.

EFFECTS OF THE INVENTION

The first and second aspects of the present technology allow unintended sound output to be inhibited in a class D amplifier that changes a peak value of a PWM signal.

Note that advantageous effects described here are not necessarily restrictive, and any of the effects described in the present disclosure may be applied.

MODE FOR CARRYING OUT THE INVENTION

Figure 1:
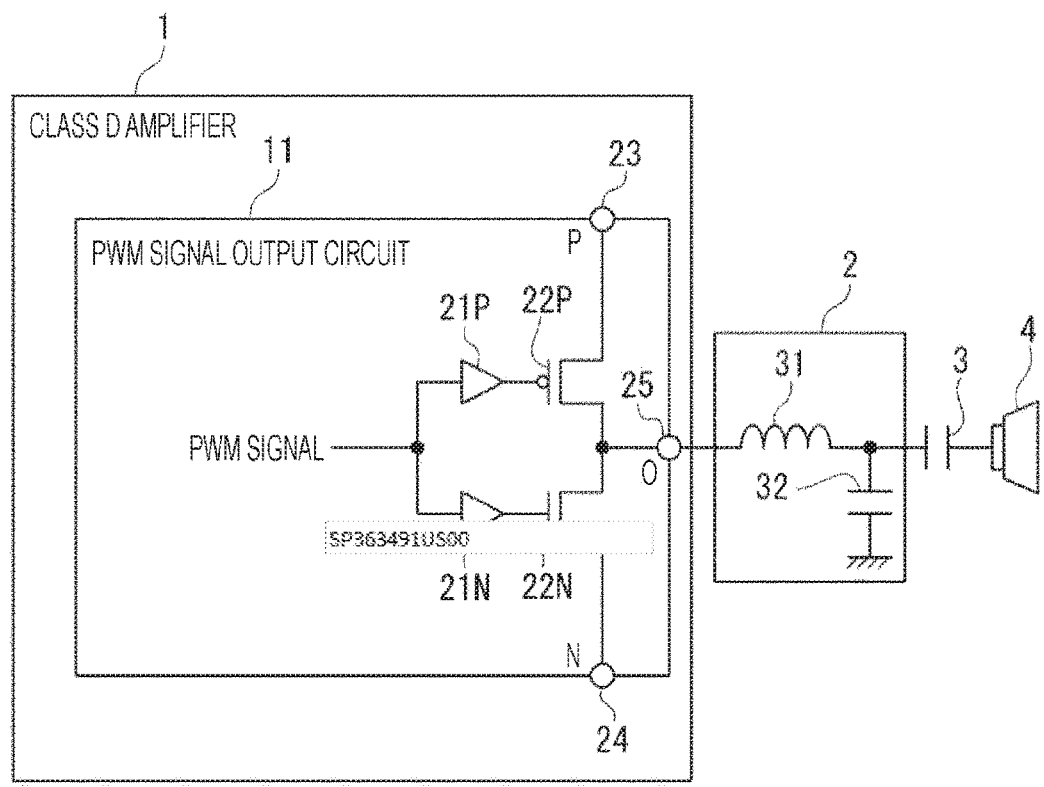
FIG. 1 is a diagram illustrating an exemplary configuration of a class D amplifier in a case where a peak value of a PWM signal is not changed.

A mode for carrying out the present technology (hereinafter referred to as an embodiment) will be described below. Note that the description will be made in the following order.

1. Exemplary configuration 1 of class D amplifier for comparison
2. Exemplary configuration 2 of class D amplifier for comparison
3. Block diagram of class D amplifier to which the present technology is applied
4. Exemplary circuit configuration of class D amplifier
5. Another exemplary circuit configuration of class D amplifier
6. Exemplary application to electronic device <1. Exemplary Configuration 1 of Class D Amplifier for Comparison>

As will be described later with reference to FIG. 5 and the like, a class D amplifier to which the present technology is applied is a class D amplifier capable of changing a peak value of a PWM signal and outputting the PWM signal; however, before this description, a configuration of a general class D amplifier in a case where a peak value of a PWM signal is not changed and in a case where a peak value of a PWM signal is changed will be described. In addition, an example of using a class D amplifier for audio applications will be described below.

FIG. 1 is a diagram illustrating an exemplary configuration of a class D amplifier 1 in a case where a peak value of a PWM signal is not changed.

The class D amplifier 1 includes a PWM signal output circuit 11, performs power amplification on an input PWM signal, and outputs the PWM signal.

The PWM signal output circuit 11 includes two buffers 21P and 21N and two transistors 22P and 22N. Among the two transistors 22P and 22N, the transistor 22P that receives output of the buffer 21P is a PMOS transistor, whereas the transistor 22N that receives output of the buffer 21N is an NMOS transistor. The PWM signal generated by a digital circuit (not illustrated) in an upstream stage of the class D amplifier 1 is input into the PWM signal output circuit 11 and supplied to the two buffers 21P and 21N arranged in parallel.

An output of the buffer 21P is connected to a gate of the PMOS transistor 22P. A drain of the PMOS transistor 22P is connected to a P terminal 23. An output of the buffer 21N is connected to a gate of the NMOS transistor 22N. A source of the NMOS transistor 22N is connected to an N terminal 24. For example, a power source voltage VDD is supplied to the P terminal 23, and for example, a ground voltage GND is supplied to the N terminal 24. Both of a source of the PMOS transistor 22 P and a drain of the NMOS transistor 22 N are connected to an output terminal 25, which serves as an output of the class D amplifier 1.

A low pass filter 2 for eliminating a high-frequency component is disposed ahead of the output of the class D amplifier 1. The low pass filter 2 includes, for example, an LC filter including a coil 31 and a capacitor 32. A capacitor 3 and a speaker 4 are disposed ahead of the low pass filter 2. The capacitor 3 is a so-called coupling capacitor for transmitting only a signal component without passing a DC bias current through the speaker 4.

A PWM signal of a peak value according to a fixed voltage supplied to each of the P terminal 23 and the N terminal 24 is output from the class D amplifier 1 of FIG. 1, and supplied to the speaker 4 via the low pass filter 2.

<2. Exemplary Configuration 2 of class D Amplifier for Comparison>

Figure 2:
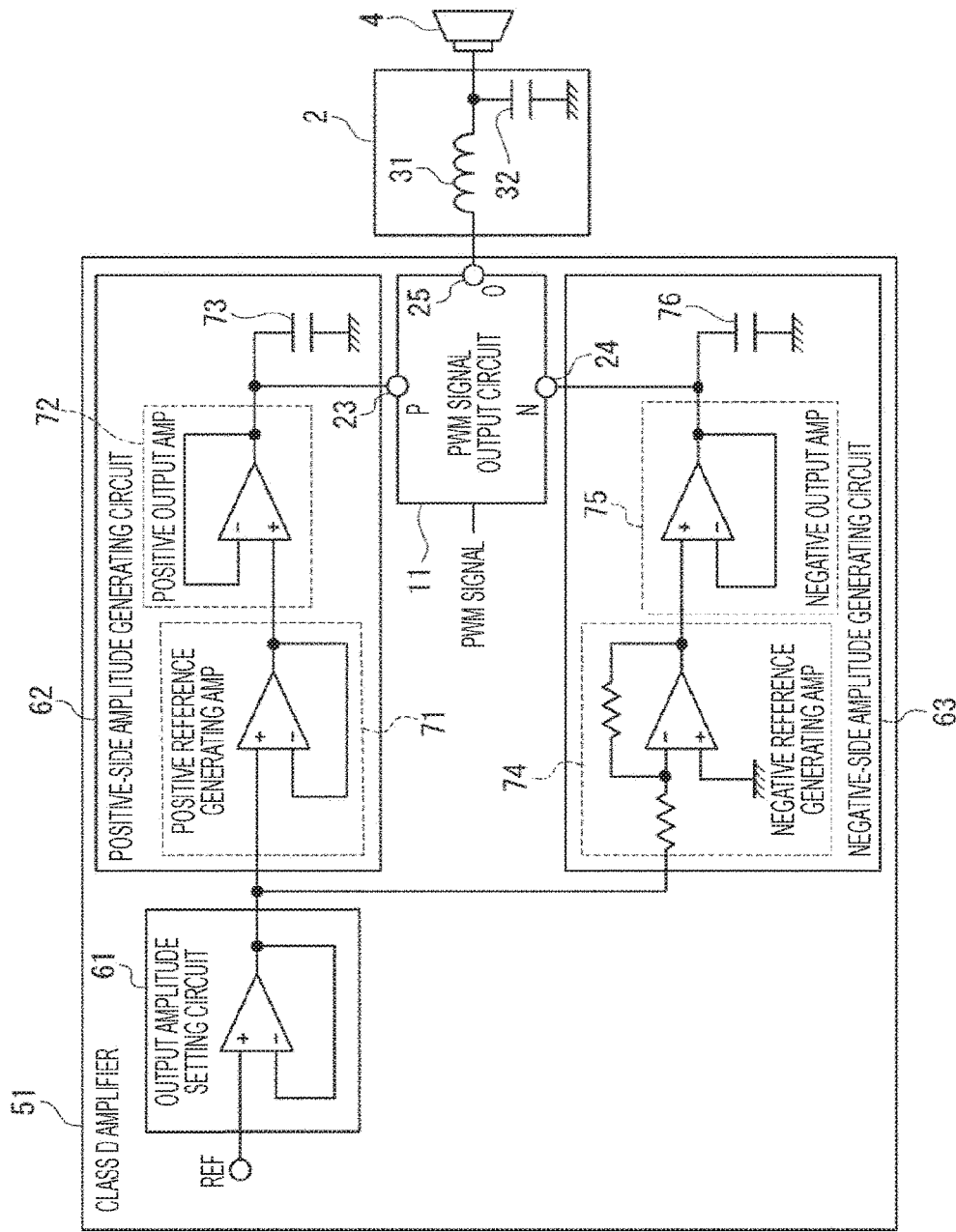
FIG. 2 is a diagram illustrating an exemplary configuration of the class D amplifier in a case where a peak value of a PWM signal is changed.

FIG. 2 illustrates an exemplary configuration of a class D amplifier 51 in a case where a peak value of a PWM signal is changed.

The class D amplifier 51, which performs power amplification on the input PWM signal and outputting the PWM signal, controls an output level by changing not only a time width of the PWM signal but also the peak value. In a case where the peak value is fixed, a noise level of the PWM signal is determined by an operating frequency and a modulation method of a digital circuit in an upstream stage (not illustrated), whereas in a case where the peak value is variable, the output noise level can be reduced by reducing the peak value and reducing the output level. In the class D amplifier 51 for audio applications, the peak value is changed (controlled), for example, according to a volume level of a sound that is output from the speaker 4.

The class D amplifier 51 includes a PWM signal output circuit 11 similar to the PWM signal output circuit 11 of the class D amplifier 1 of FIG. 1.

Also, the class D amplifier 51 further includes an output amplitude setting circuit 61, a positive-side amplitude generating circuit 62, and a negative-side amplitude generating circuit 63.

The output amplitude setting circuit 61 controls amplitude (peak value) of the PWM signal, for example, according to a volume level of an audio player or the like in which the class D amplifier 51 is incorporated. A reference voltage REF that is input into the output amplitude setting circuit 61 is a voltage according to the volume level.

The reference voltage REF that is output from the output amplitude setting circuit 61 is supplied to the positive-side amplitude generating circuit 62 and the negative-side amplitude generating circuit 63.

The positive-side amplitude generating circuit 62 includes a positive reference generating amp 71, a positive output amp 72, and an output capacitance 73. The positive-side amplitude generating circuit 62 multiplies, by 1 (×1), the reference voltage REF supplied from the output amplitude setting circuit 61 by the positive reference generating amp 71 and then stores the reference voltage REF in the output capacitance 73 via the positive output amp 72. Then, a positive reference voltage REF_P (=(+REF)) is supplied from the output capacitance 73 to the P terminal 23 of the PWM signal output circuit 11.

The negative-side amplitude generating circuit 63 includes a negative reference generating amp 74, a negative output amp 75, and an output capacitance 76. The negative-side amplitude generating circuit 63 multiplies, by −1 (×(−1)), the reference voltage REF supplied from the output amplitude setting circuit 61 by the negative reference generating amp 74 and then stores the reference voltage REF in the output capacitance 76 via the negative output amp 75. Then, a negative reference voltage REF_N (=(−REF)) is supplied from the output capacitance 76 to the N terminal 24 of the PWM signal output circuit 11.

Figure 3:
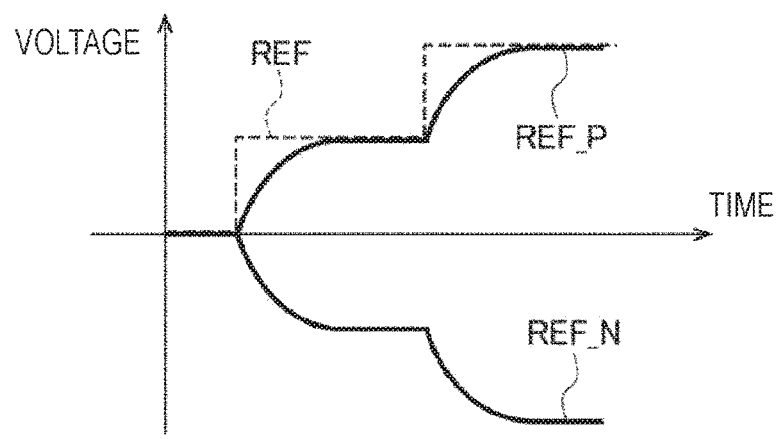
FIG. 3 is a diagram describing a change in a peak value of a PWM signal.

Thus, by providing the positive-side amplitude generating circuit 62 and the negative-side amplitude generating circuit 63, generating the positive-side reference voltage REF_P and the negative-side reference voltage REF_N from the reference voltage REF supplied from the output amplitude setting circuit 61, and supplying the positive-side reference voltage REF_P and the negative-side reference voltage REF_N to the PWM signal output circuit 11, switching signal output around a ground voltage without a DC bias as illustrated in FIG. 3 is obtained. With this arrangement, in FIG. 2, the capacitor (coupling capacitor) 3 provided between the low pass filter 2 and the speaker 4 in FIG. 1 is unnecessary.

In FIG. 3, the reference voltage REF supplied from the output amplitude setting circuit 61 is illustrated with a dashed line, and with respect to the reference voltage REF, the positive reference voltage REF_P supplied from the positive-side amplitude generating circuit 62 to the P terminal 23 and the negative reference voltage REF_N supplied from the negative-side amplitude generating circuit 63 to the N terminal 24 are illustrated with solid lines.

Figure 4:
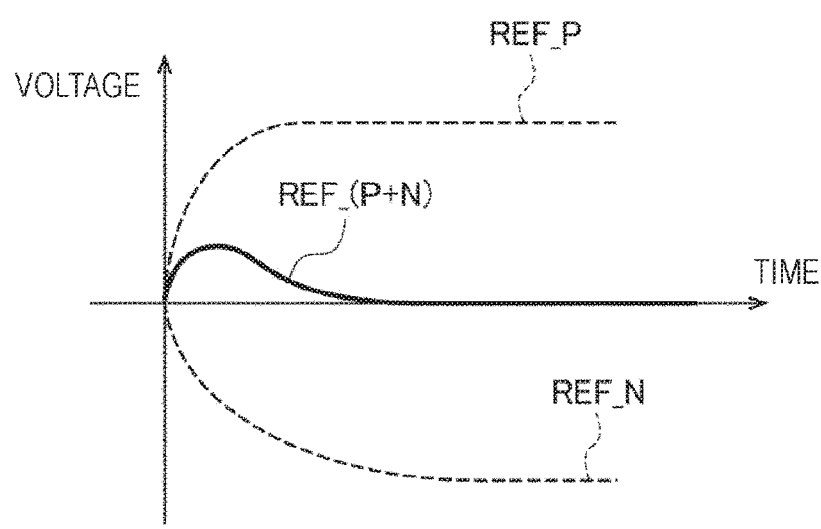
FIG. 4 is a diagram describing a response shift between a positive reference voltage REF_P and a negative reference voltage REF_N.

However, a waveform of the positive reference voltage REF_P supplied to the P terminal 23 of the PWM signal output circuit 11 and a waveform of the negative reference voltage REF_N supplied to the N terminal 24 of the PWM signal output circuit 11 illustrated in FIG. 3 indicate ideal waveforms having no factor in unevenness at all. Actually, by unevenness such as manufacturing unevenness in the positive output amp 72 and the negative output amp 75, unevenness in each component of the positive reference generating amp 71, the negative reference generating amp 74, the output capacitance 73, and the output capacitance 76, for example, as illustrated in FIG. 4, a response speed differs between the positive reference voltage REF_P the positive-side amplitude generating circuit 62 outputs and the negative reference voltage REF_N the negative-side amplitude generating circuit 63 outputs, and a change in the output level will become a transient response. A response shift REF_ (P+N) between the positive reference voltage REF_P and the negative reference voltage REF_N becomes an output signal to the speaker 4, thus causing an unusual sound called clicking noise or pop noise.

Therefore, in a class D amplifier to be described next to which the present technology is applied, a configuration that quickly adjusts the response shift REF_ (P+N) between the positive reference voltage REF_P and the negative reference voltage REF_N is employed.

<3. Block Diagram of Class D Amplifier to Which the Present Technology is Applied>

Figure 5:
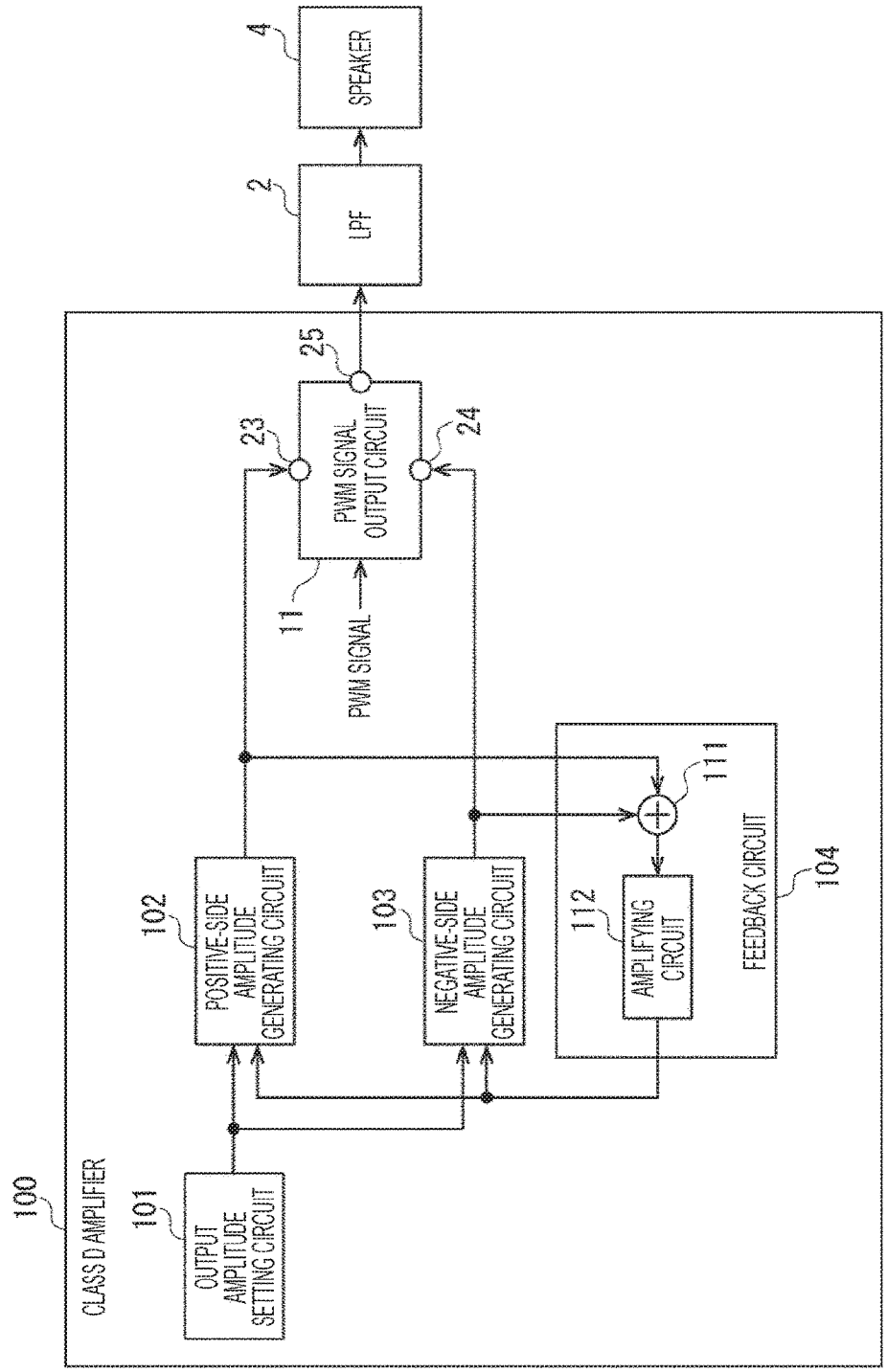
FIG. 5 is a block diagram illustrating an exemplary configuration of a class D amplifier to which the present technology is applied.

FIG. 5 is a block diagram illustrating an exemplary configuration of a class D amplifier to which the present technology is applied. Note that in FIG. 5, in a similar manner to FIGS. 1 and 2, the low pass filter (LPF) 2 and the speaker 4 connected in a downstream stage of the class D amplifier are also illustrated.

The class D amplifier 100 illustrated in FIG. 5 includes, in addition to the same PWM signal output circuit 11 as in FIGS. 1 and 2, an output amplitude setting circuit 101, a positive-side amplitude generating circuit 102, a negative-side amplitude generating circuit 103, and a feedback circuit 104. The feedback circuit 104 includes an adder 111 and an amplifying circuit 112.

The output amplitude setting circuit 101 controls amplitude (peak value) of a PWM signal. More specifically, a reference voltage REF according to presence of a silent state, a volume setting value, or the like is input from an apparatus in which the class D amplifier 100 is incorporated (for example, audio player 200 in FIG. 10), and the output amplitude setting circuit 101 outputs the same reference voltage REF as the input voltage.

On the basis of the reference voltage REF supplied from the output amplitude setting circuit 101, the positive-side amplitude generating circuit 102 generates and outputs a voltage that is positive-side amplitude (peak value) of the PWM signal. Specifically, the positive-side amplitude generating circuit 102 generates the positive reference voltage REF_P (=REF) obtained by multiplying, by 1, the reference voltage REF supplied from the output amplitude setting circuit 101 as the positive-side amplitude, and then the positive-side amplitude generating circuit 102 outputs the positive reference voltage REF_P to the P terminal 23 of the PWM signal output circuit 11 and the adder 111 of the feedback circuit 104.

On the basis of the reference voltage REF supplied from the output amplitude setting circuit 101, the negative-side amplitude generating circuit 103 generates and outputs a voltage that is negative-side amplitude (peak value) of the PWM signal. Specifically, the negative-side amplitude generating circuit 103 generates the negative reference voltage REF_N (=(−REF)) obtained by multiplying, by −1, the reference voltage REF supplied from the output amplitude setting circuit 101 as the negative-side amplitude, and then the negative-side amplitude generating circuit 103 outputs the negative reference voltage REF_N to the N terminal 24 of the PWM signal output circuit 11 and the adder 111 of the feedback circuit 104.

The adder 111 of the feedback circuit 104 adds the positive reference voltage REF_P corresponding to the positive-side amplitude of the PWM signal supplied from the positive-side amplitude generating circuit 102, and the negative reference voltage REF_N corresponding to the negative-side amplitude of the PWM signal supplied from the negative-side amplitude generating circuit 103, and then the adder 111 outputs an addition result to the amplifying circuit 112.

Since the positive-side amplitude of the PWM signal supplied from the positive-side amplitude generating circuit 102 and the negative-side amplitude of the PWM signal supplied from the negative-side amplitude generating circuit 103 have the same voltage value with a disparity only in polarity, if there is no response shift, the addition result is a ground voltage (0 V) that is intermediate potential. In other words, the adder 111 calculates and outputs a difference between the positive-side amplitude of the PWM signal and the negative-side amplitude of the PWM signal.

The amplifying circuit 112 of the feedback circuit 104 amplifies the addition result supplied from the adder 111 and supplies the addition result to the positive-side amplitude generating circuit 102 and the negative-side amplitude generating circuit 103.

Therefore, the feedback circuit 104 as a whole calculates the difference between the positive-side amplitude of the PWM signal and the negative-side amplitude of the PWM signal, and feeds back the difference to the positive-side amplitude generating circuit 102 and the negative-side amplitude generating circuit 103.

<4. Exemplary Circuit Configuration of Class D Amplifier>

Figure 6:
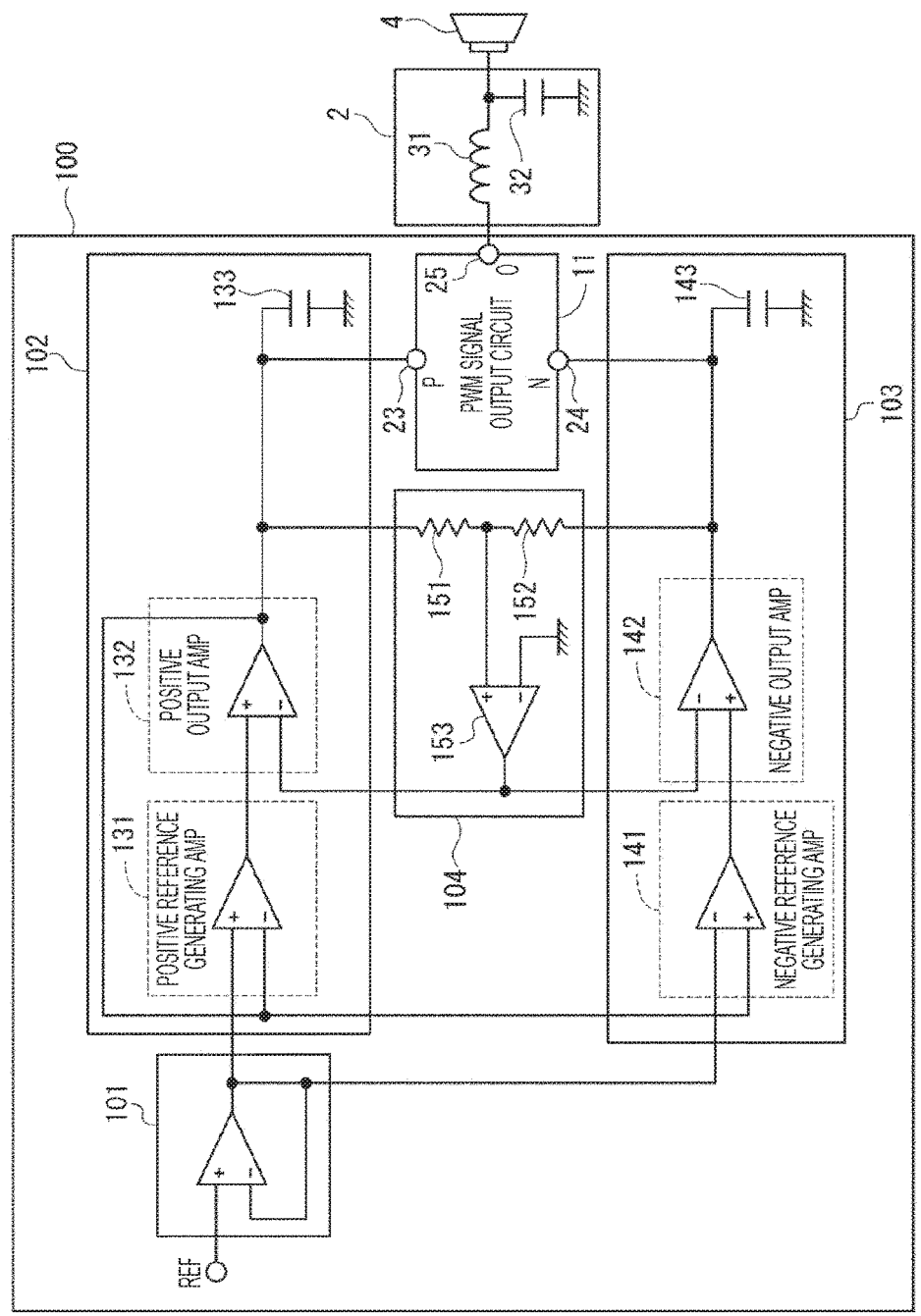
FIG. 6 is a diagram illustrating a circuit configuration of the class D amplifier of FIG. 5.

FIG. 6 is a diagram illustrating a circuit configuration of the class D amplifier 100 corresponding to the block diagram illustrated in FIG. 5.

Note that the configurations of the low pass filter 2 and the speaker 4 in a downstream stage of the class D amplifier 100 are similar to the configurations in FIGS. 1 and 2, and thus description thereof will be omitted.

The output amplitude setting circuit 101 includes, for example, a variable-output-voltage voltage regulator (low dropout regulator), and outputs a reference voltage REF according to a volume level.

The positive-side amplitude generating circuit 102 includes a positive reference generating amp 131, a positive output amp 132, and an output capacitance 133.

The positive reference generating amp 131 includes an operational amplifier, output of the output amplitude setting circuit 101 is supplied to a noninverting input terminal of the operational amplifier, and output of the positive output amp 132 is supplied to an inverting input terminal. Output of the positive reference generating amp 131 is supplied to a noninverting input terminal of the positive output amp 132.

The positive output amp 132 includes an operational amplifier, the output of the positive reference generating amp 131 is supplied to the noninverting input terminal of the operational amplifier, and output of the feedback circuit 104 is supplied to an inverting input terminal. The output of the positive output amp 132 is supplied to the inverting input terminal of the positive reference generating amp 131, the output capacitance 133, and the feedback circuit 104. The output capacitance 133 stores the output of the positive output amp 132, and the positive reference voltage REF_P is supplied from the output capacitance 133 to the P terminal 23 of the PWM signal output circuit 11.

The negative-side amplitude generating circuit 103 includes a negative reference generating amp 141, a negative output amp 142, and an output capacitance 143.

The negative reference generating amp 141 includes an operational amplifier, the output of the output amplitude setting circuit 101 is supplied to an inverting input terminal of the operational amplifier, and the output of the positive output amp 132 is supplied to a noninverting input terminal. Output of the negative reference generating amp 141 is supplied to a noninverting input terminal of the negative output amp 142.

The negative output amp 142 includes an operational amplifier, the output of the negative reference generating amp 141 is supplied to a noninverting input terminal of the operational amplifier, and the output of the feedback circuit 104 is supplied to an inverting input terminal. Output of the negative output amp 142 is supplied to the output capacitance 143 and the feedback circuit 104. The output capacitance 143 stores the output of the negative output amp 142, and the negative reference voltage REF_N is supplied from the output capacitance 143 to the N terminal 24 of the PWM signal output circuit 11.

The feedback circuit 104 includes resistors 151 and 152 and a positive and negative balance amp 153. The resistors 151 and 152 correspond to the adder 111 in FIG. 5, and the positive and negative balance amp 153 corresponds to the amplifying circuit 112 in FIG. 5. The feedback circuit 104 is configured such that impedance of the resistors 151 and 152 is higher than impedance of the PWM signal output circuit 11.

An operation of the class D amplifier 100 of FIG. 6 will be described.

The output amplitude setting circuit 101 outputs the reference voltage REF according to a volume level or the like to the positive reference generating amp 131 and the negative reference generating amp 141.

The positive reference generating amp 131 causes output of the positive output amp 132 to be fed back and input, generates the positive reference voltage REF_P obtained by multiplying, by 1 (×1), the reference voltage REF supplied from the output amplitude setting circuit 101, and outputs the positive reference voltage REF_P to the positive output amp 132.

The positive output amp 132 adjusts and outputs the positive reference voltage REF_P supplied from the positive reference generating amp 131, on the basis of a difference REF_DIF between the positive reference voltage REF_P and the negative reference voltage REF_N supplied from the positive and negative balance amp 153 of the feedback circuit 104.

The output capacitance 133 stores the positive reference voltage REF_P supplied from the positive output amp 132 and supplies the positive reference voltage REF_P to the P terminal 23 of the PWM signal output circuit 11 and the resistor 151.

The negative reference generating amp 141 causes the output of the positive output amp 132 to be fed back and input, generates the negative reference voltage REF_N obtained by multiplying, by −1 (×−1), the reference voltage REF supplied from the output amplitude setting circuit 101, and outputs the negative reference voltage REF_N to the negative output amp 142.

The negative output amp 142 adjusts and outputs the negative reference voltage REF_N supplied from the negative reference generating amp 141, on the basis of the difference REF_DIF between the positive reference voltage REF_P and the negative reference voltage REF_N supplied from the positive and negative balance amp 153 of the feedback circuit 104.

The output capacitance 143 stores the negative reference voltage REF_N supplied from the negative output amp 142 and supplies the negative reference voltage REF_N to the N terminal 24 of the PWM signal output circuit 11 and the resistor 152.

The PWM signal output circuit 11 outputs a PWM signal having the positive reference voltage REF_P supplied to the P terminal 23 as positive-side amplitude and the negative reference voltage REF_N supplied to the N terminal 24 as negative-side amplitude.

The difference REF_DIF between the positive reference voltage REF_P and the negative reference voltage REF_N is supplied to a noninverting input terminal of the positive and negative balance amp 153 of the feedback circuit 104 via the resistor 151 and the resistor 152. A ground voltage that is intermediate potential between the positive reference voltage REF_P and the negative reference voltage REF_N in design (theoretical value) is supplied to an inverting input terminal of the positive and negative balance amp 153.

The positive and negative balance amp 153 amplifies the difference REF_DIF between the positive reference voltage REF_P and the negative reference voltage REF_N, and outputs the difference REF_DIF to the inverting input terminal of the positive output amp 132 and the inverting input terminal of the negative output amp 142.

Figure 7:
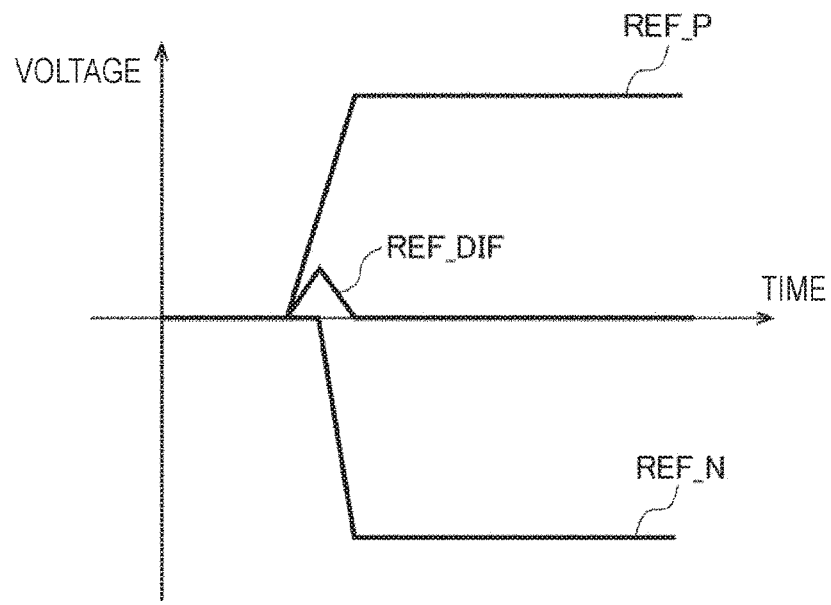
FIG. 7 is a diagram illustrating an example of a difference REF_DIF between the positive reference voltage REF_P and the negative reference voltage REF_N.

FIG. 7 illustrates an example of the difference REF_DIF between the positive reference voltage REF_P and the negative reference voltage REF_N.

In the example of FIG. 7, potential rise of the positive reference voltage REF_P that is output from the positive output amp 132 is earlier than potential drop of the negative reference voltage REF_N that is output from the negative output amp 142.

In a case where potential variation timing of the positive reference voltage REF_P is earlier than the negative reference voltage REF_N, the difference REF_DIF is a positive voltage as illustrated in FIG. 7.

In a case where the difference REF_DIF is a positive voltage, a difference between the positive reference voltage REF_P that is input into the noninverting input terminal of the positive output amp 132 and the difference REF_DIF that is input into the inverting input terminal is small. Decrease in the difference between the positive reference voltage REF_P and the difference REF_DIF acts to delay potential rise of the positive reference voltage REF_P to be output in the positive output amp 132.

On the other hand, in a case where the difference REF_DIF is a positive voltage, a difference between the negative reference voltage REF_N that is input into the noninverting input terminal of the negative output amp 142 and the difference REF_DIF that is input into the inverting input terminal is large. Increase in the difference between the negative reference voltage REF_N and the difference REF_DIF acts to advance potential drop of the negative reference voltage REF_N to be output in the negative output amp 142.

Figure 8:
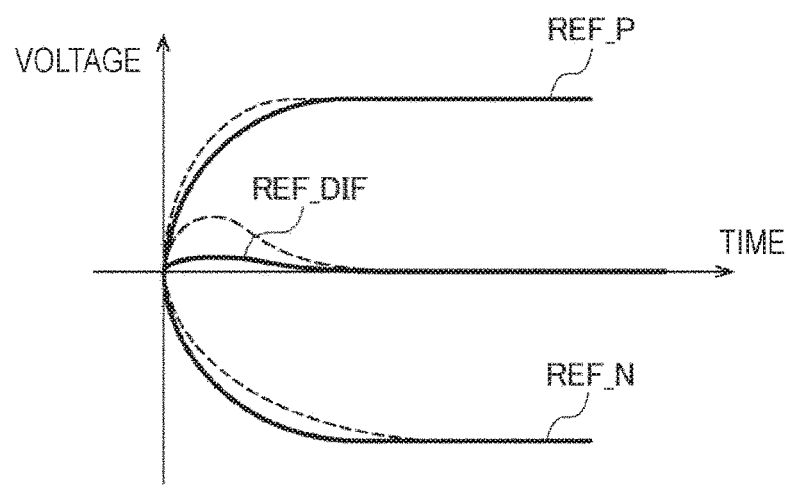
FIG. 8 is a diagram illustrating a disparity in potential variation depending on presence of a feedback circuit.

FIG. 8 is a diagram illustrating a disparity in potential variation in the positive reference voltage REF_P, the negative reference voltage REF_N, and the difference REF_DIF depending on presence of the feedback circuit 104.

In FIG. 8, solid line waveforms indicate voltage waveforms in a case where the feedback circuit 104 is present, whereas broken line waveforms indicate voltage waveforms in a case where the feedback circuit 104 is not present.

Since the feedback circuit 104 feeds back the difference REF_DIF between the positive reference voltage REF_P and the negative reference voltage REF_N to the positive output amp 132 of the positive-side amplitude generating circuit 102 and the negative output amp 142 of the negative-side amplitude generating circuit 103, as described above, for example, in a case where timing of potential variation of the positive reference voltage REF_P is earlier than negative reference voltage REF_N, the positive output amp 132 acts to delay potential rise of the positive reference voltage REF_P to be output, whereas the negative output amp 142 acts to advance potential drop of the negative reference voltage REF_N to be output. With this arrangement, as illustrated in FIG. 8, since the class D amplifier 100 operates so as to quickly correct shift between the positive reference voltage REF_P and the negative reference voltage REF_N, the difference REF_DIF between the positive reference voltage REF_P and the negative reference voltage REF_N becomes smaller than in a case where the feedback circuit 104 is not present.

As described above, since the feedback circuit 104 performs resistive division of the output of the positive output amp 132 and the output of the negative output amp 142 with the resistors 151 and 152 having higher impedance than the PWM signal output circuit 11 having low impedance, the class D amplifier 100 obtains information on the response shift between the positive output amp 132 and the negative output amp 142. Then, the positive and negative balance amp 153 feeds back a midpoint voltage of the resistive division to the positive output amp 132 and the negative output amp 142, and thus as illustrated in FIG. 8, the positive output amp 132 and the negative output amp 142 operate so as to reduce the difference REF DIF between the positive reference voltage REF_P and the negative reference voltage REF N.

<5. Another Exemplary Circuit Configuration of Class D Amplifier>

Figure 9:
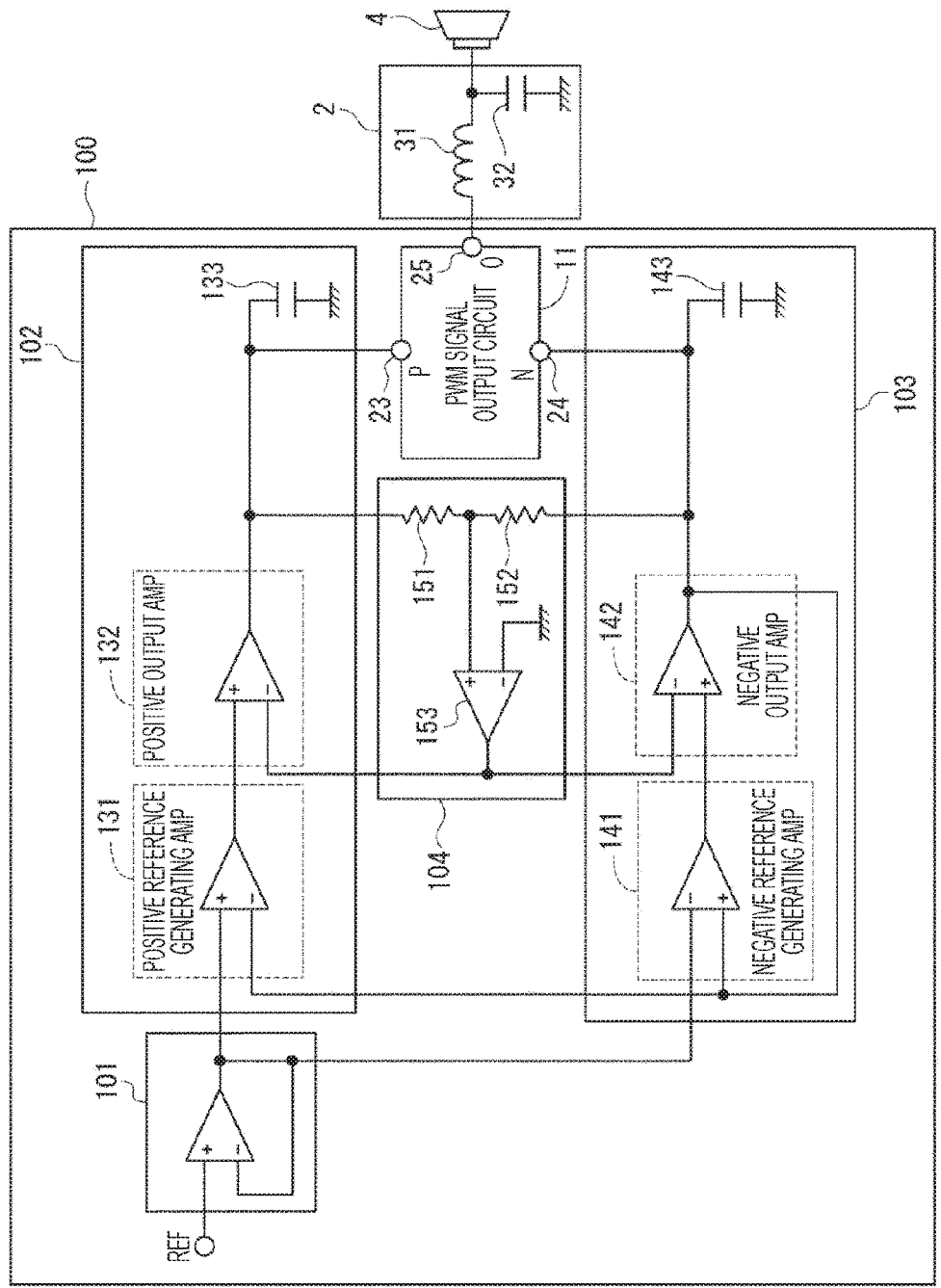
FIG. 9 is a diagram illustrating another exemplary configuration of the class D amplifier to which the present technology is applied.

FIG. 9 is a block diagram illustrating another exemplary circuit configuration of the class D amplifier 100.

In the circuit configuration of the class D amplifier 100 illustrated in FIG. 6, the output of the positive output amp 132 is fed back to the positive reference generating amp 131 and the negative reference generating amp 141.

In the circuit configuration of the class D amplifier 100 illustrated in FIG. 9, the output of the negative output amp 142 is fed back to the positive reference generating amp 131 and the negative reference generating amp 141.

In this manner, feedback to the positive reference generating amp 131 and the negative reference generating amp 141 may be sent from either one of the positive output amp 132 and the negative output amp 142. Other circuit configuration in FIG. 9 is the same as the circuit configuration illustrated in FIG. 6, and thus description thereof will be omitted.

Also in the circuit configuration of the class D amplifier 100 illustrated in FIG. 9, control is performed so as to quickly correct the imbalance between the positive reference voltage REF_P and the negative reference voltage REF_N.

In the feedback circuit 104 configured as described above including the class D amplifier 100, control is performed such that the imbalance between the positive reference voltage REF_P and the negative reference voltage REF_N is quickly corrected.

Therefore, in a case where the class D amplifier 100 is mounted as an amplifier for performing power amplification on the PWM signal that is output to the speaker 4 of an audio apparatus, an unusual sound generated by the imbalance between the positive reference voltage REF_P and the negative reference voltage REF_N decreases. That is, the class D amplifier 100 that adjusts the peak value of the PWM signal can inhibit unintended sound output.

Note that not when the reference voltage REF that is output from the output amplitude setting circuit 101 changes, but in a state where a constant voltage is output, for example, even in a case where variation occurs in the positive reference voltage REF_P or the negative reference voltage REF_N itself due to fluctuation in the power source voltage or the like, the feedback circuit 104 operates to reduce the difference REF DIF between the positive reference voltage REF_P and the negative reference voltage REF_N. From this point of view, the feedback circuit 104 of the class D amplifier 100 also has a functional effect of outputting a PWM signal with low noise and low distortion.

<6. Exemplary Application to Electronic Device>

The present technology is not limited to application to the class D amplifier. That is, the present technology is applicable to electronic devices as a whole having a sound output function such as, for example, an audio player that outputs a sound on the basis of an audio signal, a portable terminal apparatus having a sound output function such as a smartphone and a tablet, a copying machine, a printer apparatus, and an imaging apparatus having a sound output function.

Figure 10:
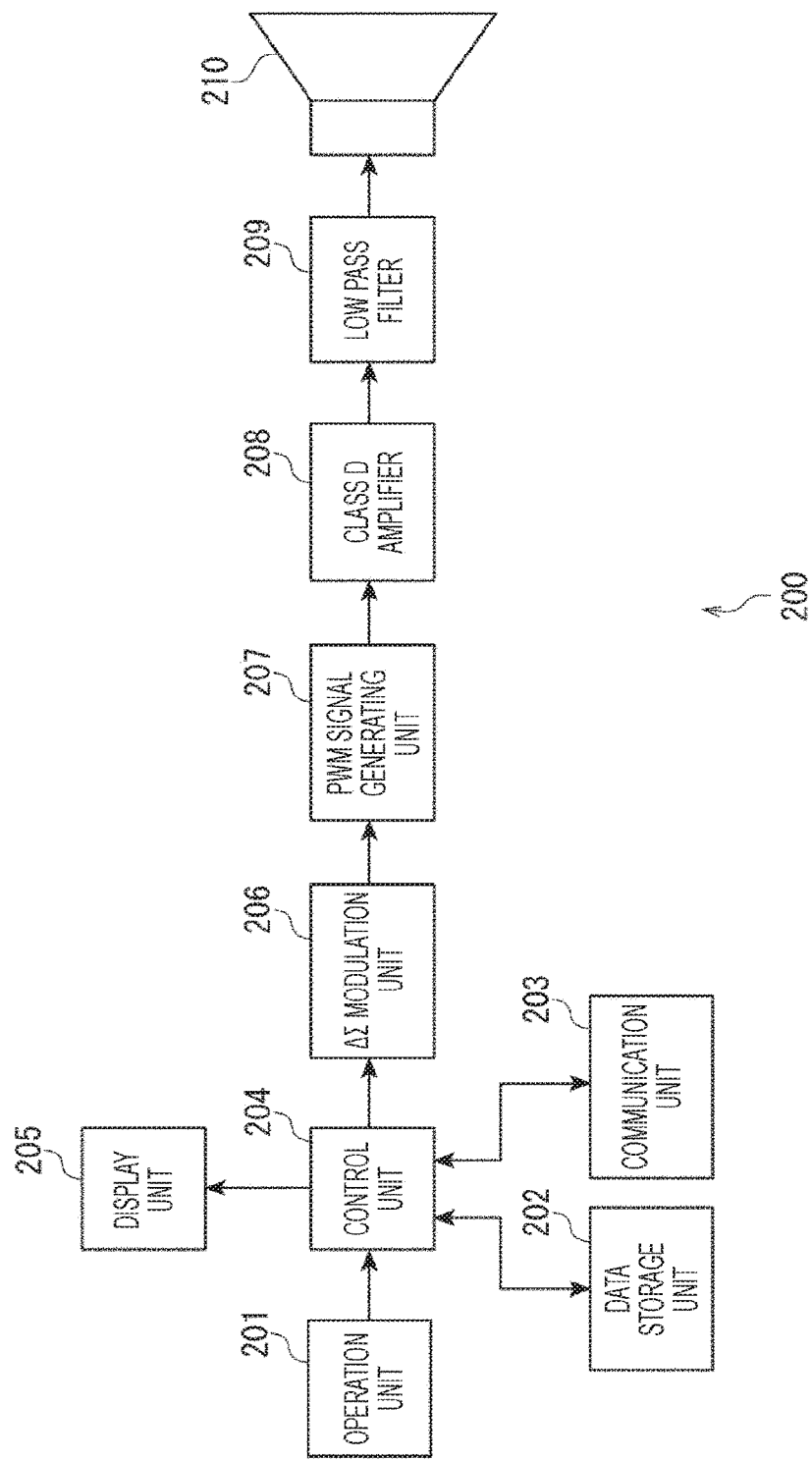
FIG. 10 is a block diagram illustrating an exemplary configuration of an audio player as an electronic device that employs the present technology.

FIG. 10 is a block diagram illustrating an exemplary configuration of an audio player as an electronic device that employs the present technology.

The audio player 200 of FIG. 10 includes an operation unit 201, a data storage unit 202, a communication unit 203, a control unit 204, a display unit 205, a delta sigma (ΔΣ) modulation unit 206, a PWM signal generating unit 207, a class D amplifier 208, a low pass filter 209, and a speaker 210.

The operation unit 201 receives a user's operation such as reproduction and stop of a predetermined music piece (music) stored in the data storage unit 202, and supplies an operation signal corresponding to the received operation to the control unit 204.

The data storage unit 202 includes, for example, a semiconductor memory and the like, and stores data of a plurality of music pieces in a predetermined data format (for example, moving picture experts group (MPEG) 1 audio layer 3 (MP3)). Also, the data storage unit 202 stores a program and the like for the control unit 204 to control the overall operation of the audio player 200.

The communication unit 203 includes, for example, an interface such as a universal serial bus (USB) interface, and under control of the control unit 204, the communication unit 203 connects with an external apparatus to transmit and receive audio data and the like. Also, the communication unit 203 may include a network interface and the like to connect with a local area network, the Internet, and other networks, and may connect with an external apparatus via a network and exchange audio data and the like.

The control unit 204 includes, for example, a central processing unit (CPU), a random access memory (RAM), and the like, and controls the overall operation of the audio player 200. For example, in a case where an operation signal in which reproduction of a predetermined music piece stored in the data storage unit 202 is operated by a user is supplied from the operation unit 201, the control unit 204 acquires audio data of the music piece instructed to reproduce from the data storage unit 202 and supplies the audio data to the delta sigma modulation unit 206. Also, the control unit 204 controls an image to display on the display unit 205.

The display unit 205 includes, for example, a liquid crystal display (LCD), an electro luminescence (EL) display, and the like, and under control of the control unit 204, the display unit 205 displays a title and reproduction time of the music piece that is being reproduced, the audio data stored in the data storage unit 202, and the like.

The delta sigma modulation unit 206 applies delta sigma modulation processing to the audio data supplied from the control unit 204, generates N-bit digital data (N>0) that has undergone the delta sigma modulation, and outputs the digital data to the PWM signal generating unit 207.

The PWM signal generating unit 207 converts the N-bit digital data that has undergone the delta sigma modulation supplied from the delta sigma modulation unit 206 into a PWM signal as an audio signal, and outputs the PWM signal to the class D amplifier 208.

The class D amplifier 208 performs power amplification on the PWM signal supplied from the PWM signal generating unit 207, and outputs the PWM signal. As a configuration of the class D amplifier 208, the configuration of the class D amplifier 100 in FIG. 6 or 9 is employed. A volume setting value that is set by a volume button of the operation unit 201 or the like and the reference voltage REF controlled according to presence of a silent state are supplied to the output amplitude setting circuit 101 of the class D amplifier 208.

The low pass filter 209 applies filtering processing for eliminating a high-frequency component to the PWM signal that is output from the class D amplifier 208, and outputs the signal that has undergone the filtering processing to the speaker 210. The speaker 210 outputs a sound on the basis of the PWM signal supplied from the class D amplifier 208 via the low pass filter 209. The low pass filter 209 corresponds to the LC filter 2 in FIG. 6, and the speaker 210 corresponds to the speaker 4 in FIG. 6.

The delta sigma modulation unit 206, the PWM signal generating unit 207, and the class D amplifier 208 are all digital circuits, and using the class D amplifier 208 eliminates the need for an A/D converter that converts a digital signal into an analog signal, thereby allowing reduction in circuit scale.

The audio player 200 configured as described above employs the above-described configuration of the class D amplifier 100 of FIG. 6 or FIG. 9 as the class D amplifier 208, and thus the PWM signal in which an unusual sound called click noise or pop noise is suppressed can be output to the speaker 210.

Embodiments of the present technology are not limited to the embodiment described above, and various modifications may be made without departing from the spirit of the present disclosure.

For example, a mode in which all or part of the plurality of embodiments described above are combined may be employed.

For example, the present technology can have a configuration of cloud computing in which one function is shared and processed together by a plurality of apparatuses via a network.

It should be noted that effects described in the present specification are merely illustrative and not restrictive, and effects other than those described in the present specification may be produced.

Note that the present technology can also have the following configurations.

(1)

An amplifier including:

a positive-side amplitude generating circuit configured to generate positive-side amplitude of an output PWM signal that is a PWM signal to be output outside an apparatus;

a negative-side amplitude generating circuit configured to generate negative-side amplitude of the output PWM signal; and a feedback circuit configured to feed back a difference between the amplitude generated by the positive-side amplitude generating circuit and the amplitude generated by the negative-side amplitude generating circuit to the positive-side amplitude generating circuit and the negative-side amplitude generating circuit.

(2)

The amplifier according to (1) described above, further including an output amplitude setting circuit configured to set amplitude of the output PWM signal, in which the output PWM signal of the amplitude that is set by the output amplitude setting circuit is supplied to the positive-side amplitude generating circuit and the negative-side amplitude generating circuit.

(3)

The amplifier according to (2) described above, in which the positive-side amplitude generating circuit generates the same voltage value as an output voltage of the output amplitude setting circuit as the positive-side amplitude of the output PWM signal, and the negative-side amplitude generating circuit generates a voltage value different from the output voltage of the output amplitude setting circuit only in sign as the negative-side amplitude of the output PWM signal.

(4)

The amplifier according to any one of (1) to (3) described above, further including a PWM signal output circuit configured to output the output PWM signal with the amplitude generated by the positive-side amplitude generating circuit and the amplitude generated by the negative-side amplitude generating circuit.

(5)

The amplifier according to (4) described above, in which the feedback circuit generates the difference by performing resistive division with impedance higher than impedance of the PWM signal output circuit, and feeds back the difference to the positive-side amplitude generating circuit and the negative-side amplitude generating circuit.

(6)

An audio signal output method in an amplifier including a positive-side amplitude generating circuit, a negative-side amplitude generating circuit, a feedback circuit, and a PWM signal output circuit, the method including:

generating, by the positive-side amplitude generating circuit, positive-side amplitude of an output PWM signal that is a PWM signal to be output outside an apparatus;

generating, by the negative-side amplitude generating circuit, negative-side amplitude of the output PWM signal;

feeding back, by the feedback circuit, a difference between the amplitude generated by the positive-side amplitude generating circuit and the amplitude generated by the negative-side amplitude generating circuit to the positive-side amplitude generating circuit and the negative-side amplitude generating circuit; and outputting, by the PWM signal output circuit, the output PWM signal based on the amplitude generated by the positive-side amplitude generating circuit and the amplitude generated by the negative-side amplitude generating circuit as an audio signal.

(7)

An electronic device including an amplifier including:

a positive-side amplitude generating circuit configured to generate positive-side amplitude of an output PWM signal that is a PWM signal to be output outside an apparatus;

a negative-side amplitude generating circuit configured to generate negative-side amplitude of the output PWM signal; and a feedback circuit configured to feed back a difference between the amplitude generated by the positive-side amplitude generating circuit and the amplitude generated by the negative-side amplitude generating circuit to the positive-side amplitude generating circuit and the negative-side amplitude generating circuit.

(8)

The electronic device according to (7) described above, further including:

an acquisition unit configured to acquire audio data;

a PWM signal generating unit configured to generate a PWM signal corresponding to the acquired audio data; and a speaker configured to output a sound on the basis of a signal obtained by the amplifier performing power amplification on the PWM signal generated by the PWM signal generating unit.

REFERENCE SIGNS LIST

11 PWM signal output circuit
100 Class D amplifier
101 Output amplitude setting circuit
102 Positive-side amplitude generating circuit
103 Negative-side amplitude generating circuit
104 Feedback circuit
111 Adder
112 Amplifying circuit
131 Positive reference generating amp
132 Positive output amp
133 Output capacitance
141 Negative reference generating amp
142 Negative output amp
143 Output capacitance
151, 152 Resistor
153 Positive and negative balance amp
200 Audio player
201 Operation unit
204 Control unit
207 PWM signal generating unit
208 Class D amplifier
210 Speaker

The invention claimed is:

1. An amplifier, comprising:
a positive-side amplitude generating circuit configured to generate a positive-side amplitude of a Pulse Width Modulation (PWM) signal;
a negative-side amplitude generating circuit configured to generate a negative-side amplitude of the PWM signal;
a feedback circuit configured to:
generate a difference between the generated positive-side amplitude of the PWM signal and the generated negative-side amplitude of the PWM signal,
wherein the difference between the positive-side amplitude and the negative-side amplitude is generated by use of a resistive division with an impedance higher than an impedance of a PWM signal output circuit; and
feed back the generated difference to each of the positive-side amplitude generating circuit and the negative-side amplitude generating circuit; and
the PWM signal output circuit configured to output the PWM signal, based on the generated positive-side amplitude of the PWM signal and the generated negative-side amplitude of the PWM signal.

2. The amplifier according to claim 1, further comprising an output amplitude setting circuit configured to set an amplitude of a reference PWM signal,
wherein the reference PWM signal of the amplitude that is set by the output amplitude setting circuit is supplied to the positive-side amplitude generating circuit and the negative-side amplitude generating circuit.

3. The amplifier according to claim 2,
wherein the positive-side amplitude generating circuit is further configured to generate a first voltage value as the positive-side amplitude of the PWM signal,
wherein the generated first voltage value is same as a value of an output voltage of the output amplitude setting circuit,
wherein the negative-side amplitude generating circuit is further configured to generate a second voltage value as the negative-side amplitude of the PWM signal, and
wherein the generated second voltage value is different from the value of the output voltage of the output amplitude setting circuit.

4. An audio signal output method, comprising:
in an amplifier:
generating, by a positive-side amplitude generating circuit, a positive-side amplitude of a Pulse Width Modulation (PWM) signal;
generating, by a negative-side amplitude generating circuit, a negative-side amplitude of the PWM signal;
generating, by a feedback circuit, a difference between the generated positive-side amplitude of the PWM signal and the generated negative-side amplitude of the PWM signal,
wherein the difference between the positive-side amplitude and the negative-side amplitude is generated using a resistive division with an impedance higher than an impedance of a PWM signal output circuit; and
feeding back, by the feedback circuit, the generated difference to each of the positive-side amplitude generating circuit and the negative-side amplitude generating circuit; and
outputting, by the PWM signal output circuit, the PWM signal based on the generated positive-side amplitude of the PWM signal and the generated negative-side amplitude of the PWM signal,
wherein the PWM signal is output as an audio signal.

5. An electronic device, comprising:
an amplifier, wherein the amplifier comprises:
a positive-side amplitude generating circuit configured to generate a positive-side amplitude of a Pulse Width Modulation (PWM) signal;
a negative-side amplitude generating circuit configured to generate a negative-side amplitude of the PWM signal;
a feedback circuit configured to:
generate a difference between the generated positive-side amplitude of the PWM signal and the generated negative-side amplitude of the PWM signal,
wherein the difference between the positive-side amplitude and the negative-side amplitude is generated by use of a resistive division with an impedance higher than an impedance of a PWM signal output circuit; and
feed back the generated difference to each of the positive-side amplitude generating circuit and the negative-side amplitude generating circuit; and
the PWM signal output circuit configured to output the PWM signal, based on the generated positive-side amplitude of the PWM signal and the generated negative-side amplitude of the PWM signal.

6. The electronic device according to claim 5, further comprising:
circuitry configured to:
acquire audio data;
generate the PWM signal corresponding to the acquired audio data; and
power amplify the generated PWM signal; and
a speaker configured to output a sound based on the power amplified PWM signal.

7. An amplifier, comprising:
a positive-side amplitude generating circuit configured to generate a positive-side amplitude of a Pulse Width Modulation (PWM) signal;
a negative-side amplitude generating circuit configured to generate a negative-side amplitude of the PWM signal;
a feedback circuit configured to:
generate a difference between the generated positive-side amplitude of the PWM signal and the generated negative-side amplitude of the PWM signal,
wherein the difference between the positive-side amplitude and the negative-side amplitude is generated by use of a resistive division with an impedance higher than an impedance of a PWM signal output circuit; and
feed back the generated difference to each of the positive-side amplitude generating circuit and the negative-side amplitude generating circuit;
the PWM signal output circuit configured to output the PWM signal, based on the generated positive-side amplitude of the PWM signal and the generated negative-side amplitude of the PWM signal; and
an output amplitude setting circuit configured to set an amplitude of a reference PWM signal,
wherein the reference PWM signal of the amplitude that is set by the output amplitude setting circuit is supplied to the positive-side amplitude generating circuit and the negative-side amplitude generating circuit,
wherein the positive-side amplitude generating circuit is further configured to generate a first voltage value as the positive-side amplitude of the PWM signal,
wherein the generated first voltage value is same as a value of an output voltage of the output amplitude setting circuit,
wherein the negative-side amplitude generating circuit is further configured to generate a second voltage value as the negative-side amplitude of the PWM signal, and
wherein the generated second voltage value is different from the value of the output voltage of the output amplitude setting circuit.

* * * * *